United States Patent
Stanton et al.

(10) Patent No.: US 9,702,907 B2
(45) Date of Patent: Jul. 11, 2017

(54) FREQUENCY MASK TRIGGER WITH NON-UNIFORM BANDWIDTH SEGMENTS

(75) Inventors: Steven W. Stanton, Aloha, OR (US); Edward C. Gee, Camas, WA (US); Alfred K. Hillman, Jr., Banks, OR (US)

(73) Assignee: Tektronix, Inc., Beaverton, OR (US)

( * ) Notice: Subject to any disclaimer, the term of this patent is extended or adjusted under 35 U.S.C. 154(b) by 668 days.

(21) Appl. No.: 13/328,098

(22) Filed: Dec. 16, 2011

(65) Prior Publication Data

US 2013/0158923 A1  Jun. 20, 2013

(51) Int. Cl.
| | |
|---|---|
| G06F 17/00 | (2006.01) |
| G01R 13/02 | (2006.01) |
| G01R 23/18 | (2006.01) |
| G01R 23/16 | (2006.01) |

(Continued)

(52) U.S. Cl.
CPC ......... G01R 13/0254 (2013.01); G01R 23/18 (2013.01); *G01R 23/02* (2013.01); *G01R 23/16* (2013.01); *G01R 23/20* (2013.01); *G06F 17/00* (2013.01)

(58) Field of Classification Search
CPC ........ G01R 23/16; G01R 23/18; G01R 23/02; G01R 23/20; G01R 23/165; G01R 23/10; G01R 13/0254; G01R 29/26; G01R 31/2841; G01R 13/02; G01R 13/16;

(Continued)

(56) References Cited

U.S. PATENT DOCUMENTS

| | | | |
|---|---|---|---|
| 5,103,402 A | 4/1992 | Morton et al. | |
| 8,542,062 B2* | 9/2013 | Farahani Samani et al. | 330/149 |
| 2003/0098682 A1 | 5/2003 | Jin et al. | |

(Continued)

FOREIGN PATENT DOCUMENTS

| | | |
|---|---|---|
| CN | 1725024 A | 1/2006 |
| CN | 101923113 A | 12/2010 |

(Continued)

OTHER PUBLICATIONS

Spectrum Emission Mask Measurement Description, 5 pages, Jan. 2009.*

(Continued)

*Primary Examiner* — Jonathan C Teixeira Moffat
*Assistant Examiner* — Lynda Dinh
(74) *Attorney, Agent, or Firm* — Andrew J. Harrington; Marger Johnson; Michael A. Nelson

(57) ABSTRACT

Disclosed is a test and measurement instrument having a multiple variable bandwidth frequency mask. The instrument includes an input processor for receiving an input signal and producing a digital signal, as well as a trigger signal generator for generating a trigger signal on the occurrence of a trigger event. A time to frequency converter converts a frame of digital data from the digital signal into a frequency spectrum having at least two frequency bins of dissimilar frequency widths. Each frequency bin has a power amplitude value. The trigger signal is generated when the power amplitude value of any of the at least two frequency bins violates an associated reference power level. In some cases the output may be shown as a density trace, and the trigger signal generated when any point of the density trace violates an associated density threshold.

20 Claims, 6 Drawing Sheets

(51) Int. Cl.
  *G01R 23/02* (2006.01)
  *G01R 23/20* (2006.01)
(58) Field of Classification Search
  CPC ......... G01R 13/18; G01R 13/20; G06F 19/00; G06F 17/00
  USPC .......................................................... 702/76
  See application file for complete search history.

(56) References Cited

U.S. PATENT DOCUMENTS

| | | |
|---|---|---|
| 2005/0197068 A1 | 9/2005 | Gumm |
| 2006/0015277 A1* | 1/2006 | Bernard et al. ................. 702/76 |
| 2007/0027675 A1 | 2/2007 | Hertz |
| 2007/0250558 A1 | 10/2007 | Feldhaus et al. |
| 2008/0052335 A1* | 2/2008 | Gee ............... 708/400 |
| 2009/0047920 A1 | 2/2009 | Livsics et al. |
| 2009/0082982 A1* | 3/2009 | Cain ............................ 702/77 |
| 2010/0204938 A1* | 8/2010 | Hillman et al. ................. 702/76 |
| 2010/0204939 A1 | 8/2010 | Hillman, Jr. et al. |
| 2011/0282610 A1* | 11/2011 | Engholm et al. ............... 702/67 |

FOREIGN PATENT DOCUMENTS

| | | |
|---|---|---|
| CN | 102012457 A | 4/2011 |
| DE | 4330425 A1 | 3/1994 |
| DE | 102004047042 A1 | 4/2006 |
| EP | 1699142 A1 | 9/2006 |
| EP | 2219037 A2 | 8/2010 |
| EP | 2386869 A2 | 11/2011 |
| WO | 2011059432 A1 | 5/2011 |

OTHER PUBLICATIONS

International Search Report from EP No. 12197145.1, dated Apr. 8, 2013, 8 pages.

* cited by examiner

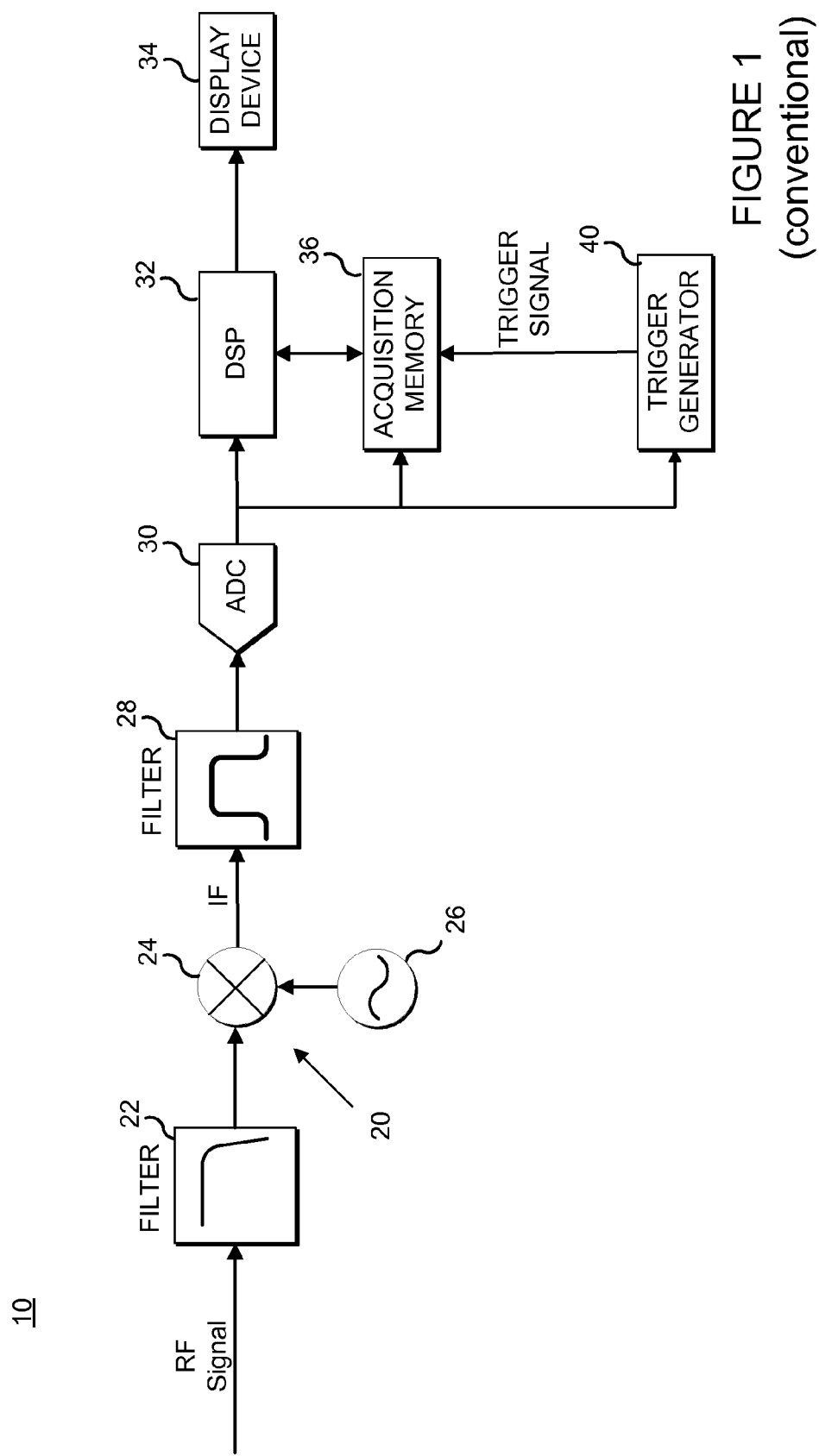
FIGURE 1 (conventional)

US 9,702,907 B2

FREQUENCY MASK TRIGGER WITH NON-UNIFORM BANDWIDTH SEGMENTS

FIELD OF THE INVENTION

This disclosure is directed toward test and measurement instruments, and, more particularly, to triggers for use in the frequency domain.

BACKGROUND

Real-time spectrum analyzers such as the RSA6100, RSA5100, and RSA3400 families available from Tektronix, Inc. of Beaverton, Oreg. trigger on, capture, and analyze RF signals in real-time. These test and measurement instruments seamlessly capture RF signals so that, unlike conventional swept spectrum analyzers and vector signal analyzers, no data is missed within a specified bandwidth.

These instruments have the capability to trigger on events which occur in the frequency domain. This capability, known as a "frequency mask trigger," is described in U.S. Pat. No. 5,103,402. The frequency mask trigger calculates the frequency spectrum of real-time data provided by the instrument's receiver system and then compares the frequency spectrum to a user-defined frequency mask. When the frequency spectrum violates the frequency mask, a trigger signal is generated which causes a seamless block of data representing the received RF signal to be stored containing the triggering event as well what happened immediately before and immediately after the triggering event. In this manner the frequency mask trigger waits for a single specific spectral event to occur.

With this background, the advantages and other novel features of the present invention are apparent from the following detailed description when read in conjunction with the appended claims and attached drawings.

SUMMARY OF THE INVENTION

In some instances, a user may want to trigger on events processed through a set of filters that are not equally spaced. In other words, present triggers are structured to operate only when events are processed through a set of equally spaced, or equal bandwidth, filters placed at regular intervals across the frequency range of interest. This limitation prevents application of triggering events in systems that include spectral measurements in varying bandwidths over the spectral band of interest.

For example, spectral emission masks (SEMs) are commonly used in communication systems as a method of measuring the energy both inside and outside of a defined communications band in order to limit interference in adjacent bands. SEMs may specify that spectral measurements be performed in varying bandwidths over the spectral band of interest. However, because of the previously described limitation where present triggers only operate in bandwidths having a single width, present triggering systems are unable to effectively operate as SEMs.

Swept spectrum analyzers measure SEMs in two ways. They may sweep the entire band defined by the SEM in a narrow resolution bandwidth (RBW), and then mathematically convert the measurement to a new bandwidth(s). This method has two deficiencies. First, when emissions are measured in a narrow bandwidth, transients and impulse noise that occurs faster than the original resolution bandwidth time constant are reduced in amplitude, resulting in measurement error. Second, transient interference occurring over the measurement period can be missed entirely. This is because the swept analyzer measures only a small part of the band at any one time. When a transient occurs outside the resolution bandwidth, it is missed entirely, again causing measurement error. Swept spectrum analyzers may also measure SEMs by sweeping the band defined by the SEM in segments, changing the resolution bandwidth of each segment to the bandwidth required by the SEM. This eliminates the first deficiency described above, but can exacerbate the second deficiency because the segmented sweep can take longer to perform than the single RBW sweep, and more information is lost as a result.

Spectrum analyzers that use contiguous time-domain data transformed into the frequency domain (sometimes called FFT-based analyzers, and a method also used by Real Time Spectrum Analyzers (RTSAs) may avoid both problems described above. They are able to re-process the time domain data in different bandwidths and produce a combined result. Since the analysis in each bandwidth is performed on the same time domain data, both problems described with respect to swept spectrum analyzers above are eliminated. However, all current implementations of this method use a batch-processed signal analysis method. This means that the time domain data must first be stored in memory, recalled, and then processed. During the storage, recall and processing time, significant information is lost that cannot be recovered.

None of the techniques described above can be used to adequately trigger on an SEM violation. While both of the methods can save a resultant measurement where a violation occurred, and the FFT-based method can be used to save the underlying time domain data, neither method processes the measurement in real time, and both methods miss large portions of the incoming data.

Embodiments of the invention address such limitations by including a frequency mask trigger with variable bandwidths over the frequency band to be able to detect violations that occur in the proper detection bandwidths specified by a communication standard, which has the added benefit of easing fault detection and detection. All acquisition samples in multiple bandwidths are processed in real time, such that no samples are missing in the analysis. This analysis is then used to create a trigger to store the acquisitions that caused the violation as defined by the frequency mask.

Accordingly, embodiments of the invention provide for a test and measurement instrument having a frequency mask that is able to trigger for variable bandwidths over the frequency band. A frame of digital data is converted from a digital signal into a frequency spectrum having at least two frequency bins having different bandwidths. Each frequency bin also has a selected power amplitude value. A trigger signal is generated when the power amplitude value of any of the at least two frequency bins violates an associated reference power level.

The objects, advantages and other novel features of the present invention are apparent from the following detailed description when read in conjunction with the appended claims and attached drawings.

BRIEF DESCRIPTION OF THE DRAWINGS

FIG. 1 is a functional block diagram of a conventional real-time spectrum analyzer with a trigger generator.

DETAILED DESCRIPTION

Figure 2:
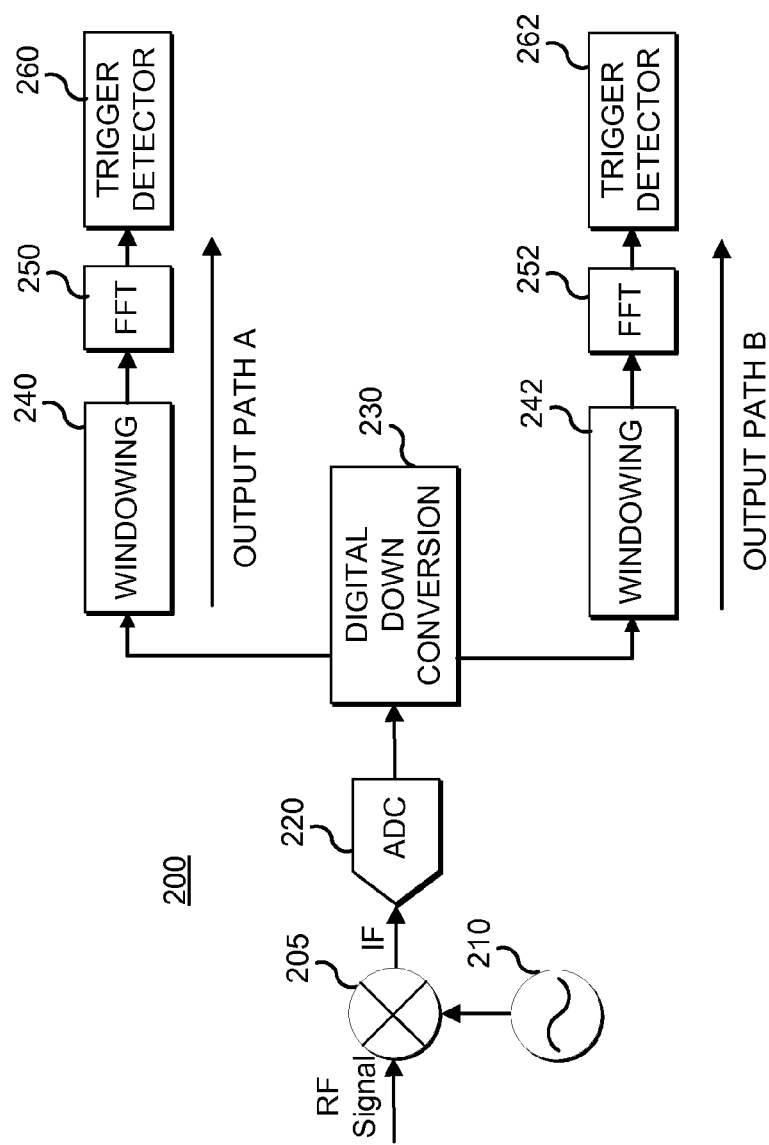
FIG. 2 is a functional block diagram of portions of a test and measurement instrument according to embodiments of the invention.

Referring now to FIG. 1, a real-time spectrum analyzer 10 is shown having an input processor 20 for receiving a radio frequency (RF) input signal. The input processor 20 includes an optional image reject filter 22 followed by a mixer 24 that converts the filtered input signal to an intermediate frequency (IF) signal using a local oscillator (LO) 26. The image reject filter 22 may be implemented using a lowpass filter, a bandpass filter, or a highpass filter. The IF signal is passed through a bandpass filter 28 and then input to an analog-to-digital (A/D) converter 30 to provide a digital signal for further processing. The digital signal is input to a digital signal processor (DSP) 32 for real-time processing for display on a monitor 34, such as in the form of a spectrogram as described in U.S. Pat. No. 4,870,348. The digital signal also is input to an acquisition memory 36 and to a trigger generator 40. In some embodiments, the acquisition memory 36 may be implemented using a circular memory. When the trigger generator 40 detects a trigger event, a trigger signal is generated that causes the acquisition memory 36 to store a seamless block of digital data from the digital signal for subsequent processing by the DSP 32 or for offloading to another processor (not shown) for non-real-time post-processing.

FIG. 2 is a functional block diagram of portions of a test and measurement instrument 200 according to embodiments of the invention. An input RF signal is converted into an IF as described above with reference to FIG. 1, and presented to an Analog-to-Digital converter 220, which converts the analog signal to a digital format. The digitized signal is then passed to a downconverter 230 for a digital down-conversion process. The downconverter 230 may adjust a sample rate which may have the effect of adjusting a resolution bandwidth (RBW), as described below. The downconverter 230 may be a re-sampler, for instance. The output of the downconverter 230 is simultaneously passed to two windowing functions 240, 242, one on each output path A or B. A pair of Fast Fourier Transformers (FFTs) 250, 252 convert the respective outputs of the windowing functions 240, 242 to a frequency spectrum. The FFTs 250, 252, may include different transforms depending on a desired frequency bin width output or effective bin width output for the particular output path. In other words, a desired width of frequency bins for either of the output paths A or B may be controlled by settings on any of the components within the path. For example, either the windowing function 240 and/or the FFT 250 may be adjusted in output path A to generate an output having particular frequency bin widths, while the windowing function 242 and/or the FFT 252 may be adjusted in output path B to have different frequency bin widths. Trigger detectors 260, 262 set trigger thresholds within their respective frequency bins, or the trigger thresholds may be set in a single process (not shown) after the outputs of the FFTs 250, 252 are combined to produce the final output. Combining trigger thresholds across multiple frequency bins creates a trigger mask.

Although only two separate output paths A and B are shown emanating from the downconverter 230, in FIG. 2, any number of output paths may be present, each of which is able to generate a trigger for particular RBW.

Figure 3:
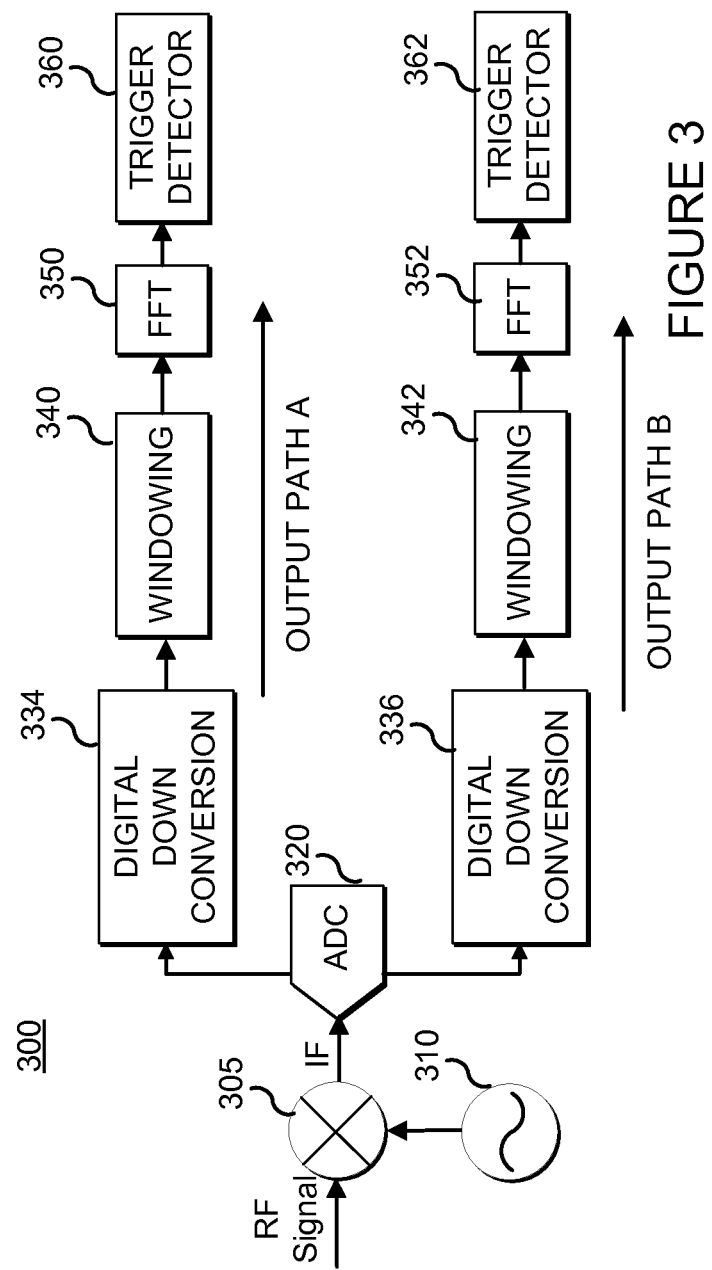
FIG. 3 is a functional block diagram of portions of a test and measurement instrument according to embodiments of the invention.

FIG. 3 is similar to that of FIG. 2, except that there are two downconverters 334, 336 present. This allows each of the independent output paths A and B for a particular RBW to set the desired width of the RBW by using its own unique downconverter. Such a variation may be preferred when it is easier to set or modify the settings on the downconverter than the windowing functions 340, 342 and/or FFTs 350, 352. Or, such a variation to use separate downconverters 334, 336 in the output paths A and B may be simply a design choice. Again, although only two output paths are illustrated in FIG. 3, embodiments of the invention may include any number of output paths.

Depending on the speed of the systems or components in use, these implementations as illustrated in FIGS. 2 and 3 might be implemented completely in hardware, completely in software running on an appropriate processor, or through some combination of hardware and software. In some embodiments, the digital signal produced by the A/D converter is first converted into in-phase and quadrature signals, and then those in-phase and quadrature signals are processed to generate a trigger signal. In embodiments of the invention, however, information obtained only after processing through differing bandwidths is used to start or stop the storage of signal samples in the storage memory. The stored data could be quadrature signal samples or some other form of sample data such as simple realtime samples of IF signal.

Figure 4:
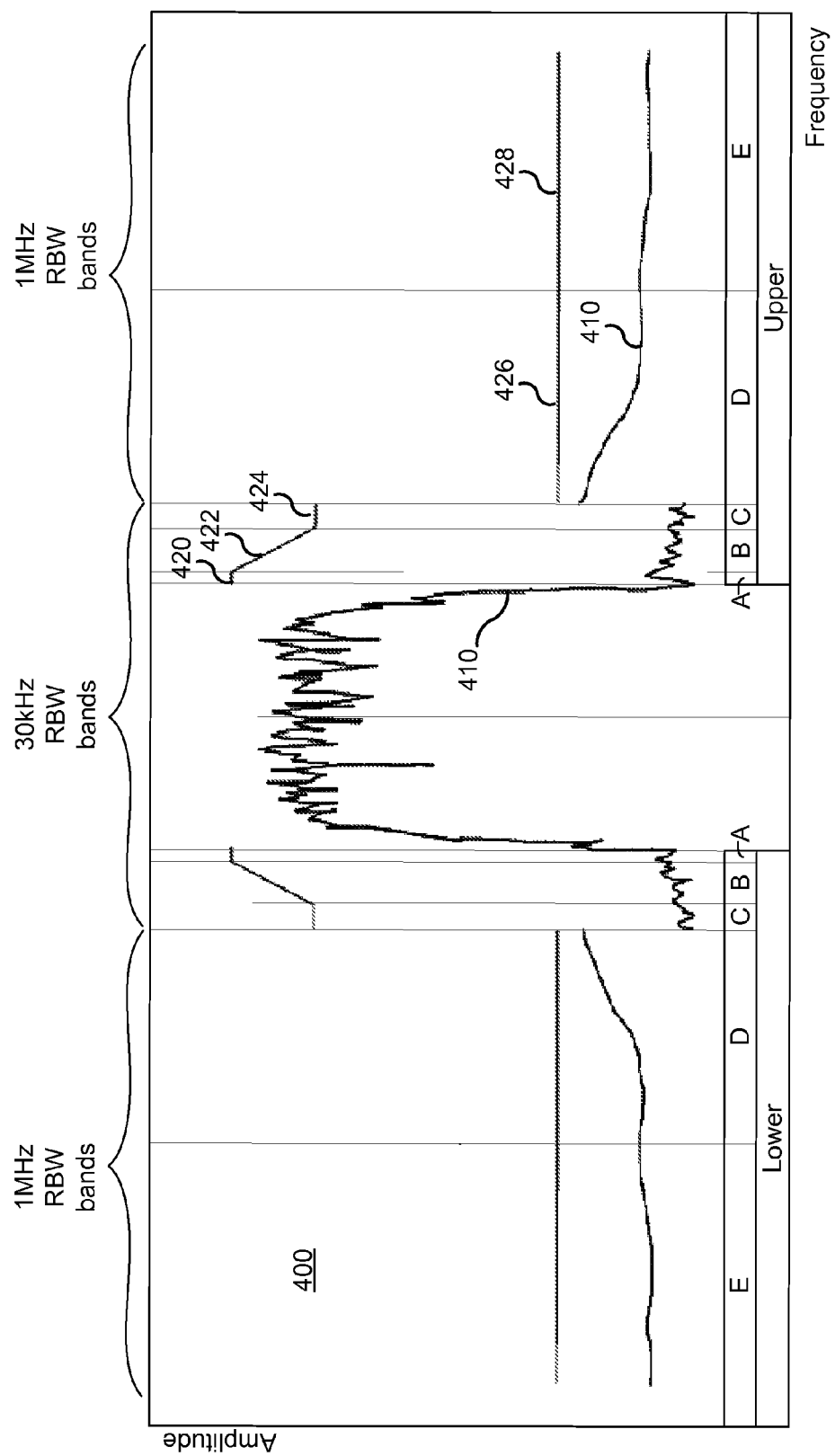
FIG. 4 is a diagram of an output of a test and measurement instrument having a frequency mask associated with a spectrum emission mask according to embodiments.

FIG. 4 illustrates a practical application of the multiple variable bandwidth frequency mask trigger according to embodiments of the invention. In FIG. 4 an output of a test and measurement instrument is illustrated generally at 400. A signal under test is illustrated as 410, which spans multiple areas A-E. The areas A-E are symmetrical about a vertical centerline which divides the output 400 into upper and lower sections. For clarity and brevity, reference is made only to the upper sections. The sections A, B, and C cover areas in which the signal under test was analyzed at 30 kHz RBW, while the same signal under test was analyzed in sections D and E at 1 MHz. A trigger level for section A, which is a particular power level for RBWs in the A area, is illustrated at 420. For section B the trigger level is set at 422, for section C at 424, for section D at 426, and for section E at 428. These trigger levels 420-428, when taken together, create a frequency mask that models or parallels an SEM.

In operation, if the signal under test 410 were to violate any of the triggers 420-428, circuitry would generate the trigger signal, causing the acquisition memory to store a seamless block of digital data from the digital version of the signal under test. To "violate" the trigger may mean to "exceed," or "to be less than," depending on a parameter, which may be user defined.

Figure 5:
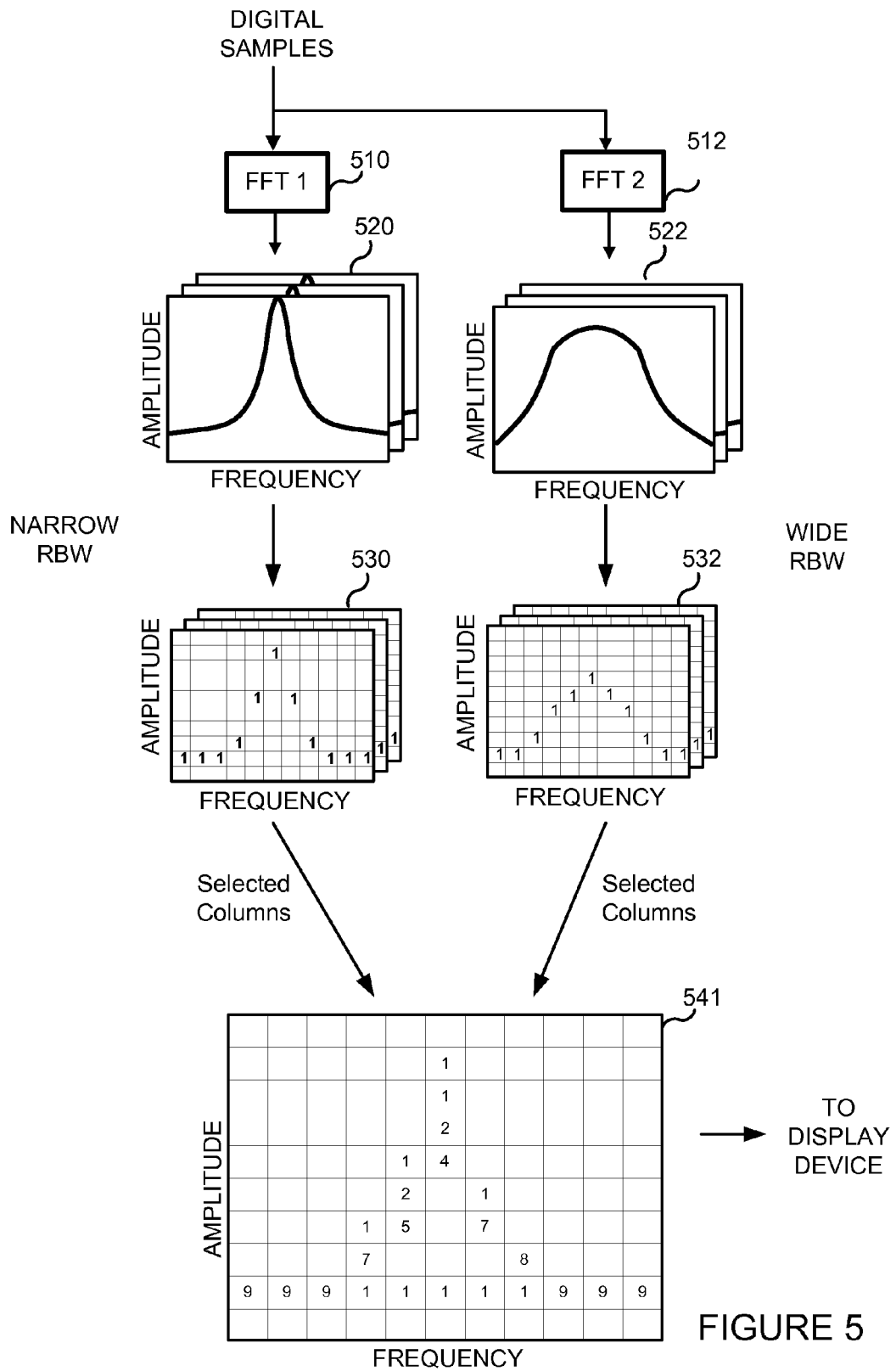
FIG. 5 is a functional block diagram of portions of a test and measurement instrument having a bitmapped display according to embodiments of the invention.

FIG. 5 illustrates another way to generate a frequency trigger across different RBWs according to embodiments of the invention. Referring now to FIG. 5, a pair of FFTs 510, 512 transform a continuous stream of digital samples into thousands of spectra 520, 522, respectively every second. In other embodiments the FFTs may include RBW windowing functions as well, as described above. Instead, the digital samples may be transformed using other transforms, such as a chirp-Z transform or the like. In one embodiment each spectrum of each spectra 520, 522 is rasterized to respectively produce a "rasterized spectrum" 530, 532. A rasterized spectrum comprises an array of cells arranged in of a series of rows and columns, with each row representing a particular amplitude value and each column representing a particular frequency value. The value of each cell is either a "1," also referred to as a "hit," which indicates that the input signal was present at that particular location in the amplitude versus frequency space during the measurement period, or a "0" (depicted as a blank cell in the Drawings), which indicates that it was not. The values of the corresponding cells of the rasterized spectra 530, 532 are combined together to form a bitmap database 541. More specifically, selected columns of the rasterized spectra 530 and selected columns of the rasterized spectra 532 are combined to make a complete bitmap database 541. In some embodiments an intermediate step (not illustrated) is performed wherein each of the rasterized spectra 530, 532 are used to create individual bitmap databases, and then selected columns of the individual bitmap databases combined to make the bitmap database 541. Then the value of each cell of the bitmap database 541 is divided by the total number of rasterized spectra 530, 532, on a column-by-column basis, so that it indicates the total number of hits during the measurement period divided by the total number of rasterized spectra 530, 532, or equivalently, the percentage of time during the measurement period that the input signal occupied that particular location in the amplitude versus frequency space, also referred to as the "density." The rasterized spectra 520, 522 and the bitmap database 541 are depicted in the Drawings as having 10 rows and 11 columns for simplicity, however it will be appreciated that in an actual embodiment, the rasterized spectra 520, 522 and the bitmap database 541 may have hundreds of columns and rows. The bitmap database 541 is essentially a three-dimensional histogram, with the x-axis being frequency, the y-axis being amplitude, and the z-axis being density. The bitmap database 541 may be displayed as an image referred to as a "bitmap" on a display device, with the density of each cell being represented by a color-graded pixel. Alternatively, the bitmap database 541 may be stored in a storage device (not shown).

Because different FFTs 510, 512 were used to create the spectra 520, 522, the rasterized spectra 530, 532 will likewise be different, even though they were created from the same digital signal.

Similar to using different RBWs on the test signal described with reference to FIG. 4 above, after final assembly from the selected columns, the bitmap database 541 will also contain columns having various "widths," i.e, representing different frequency widths, because different FFTs 510, 512 were used to create them.

Each of the frequency bins of the bitmap database 541 may include a trigger level, the combination of which makes a frequency mask. This is also referred to as a density threshold. Because the density threshold is made from bins having various widths, due to the different FFTs that ultimately made bitmap database 541, the resultant trigger likewise spans multiple widths.

In practice, the trigger signal is generated when any point of the density trace violates an associated density threshold.

Figure 6:
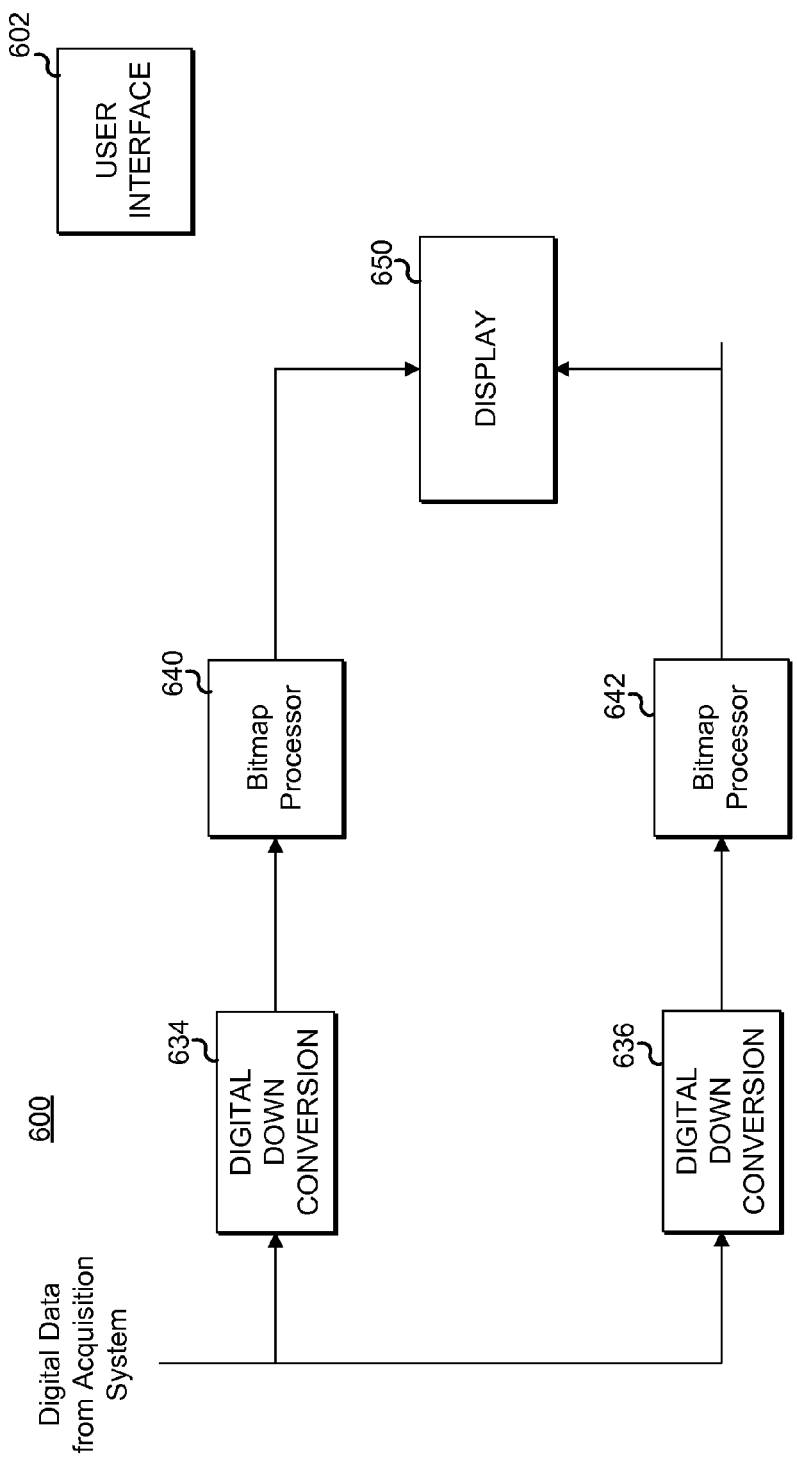
FIG. 6 is a functional block diagram of portions of a test and measurement instrument including a bitmap output according to embodiments of the invention.

FIG. 6 is a functional block diagram of portions of a test and measurement instrument including a bitmap output according to embodiments of the invention. A system 600 includes a pair of bitmap processors 640, 642, which may provide the functions of making the spectra, rasterized spectra, bitmap database, and density thresholds described above. Input to the bitmap processors 640, 642 is illustrated as being provided by respective downconverters 634, 636.

This is a different embodiment than that shown in FIG. 5, when different FFTs were used to control the widths of the RBWs in the final output. As described above with reference to FIGS. 2 and 3, any way to produce the RBWs having differing widths is acceptable, and may be determined by design choice. The resultant test and measurement output, along with the generated frequency trigger mask, embodied as a density threshold, may be shown on a display 650. In some embodiments the user may select to hide showing the density threshold on the display 650. Any of the processes illustrated may be controlled automatically, or may allow user control through a user interface 602.

Although many of the embodiments described above include a user interface, it will be appreciated that in other embodiments, those parameters may alternatively be determined automatically by a test and measurement instrument Although the embodiments illustrated and described above show the present invention being used in a real-time spectrum analyzer, it will be appreciated that embodiments of the present invention may also be used advantageously in any kind of test and measurement instrument that displays frequency domain signals, such as a swept spectrum analyzer, a signal analyzer, a vector signal analyzer, an oscilloscope, and the like.

In various embodiments, components of the invention may be implemented in hardware, software, or a combination of the two, and may comprise a general purpose microprocessor, a digital signal processor (DSP), an application specific integrated circuit (ASIC), a field-programmable gate array (FPGA), or the like.

It will be appreciated from the forgoing discussion that the present invention represents a significant advance in the field of test and measurement equipment. Although specific embodiments of the invention have been illustrated and described for purposes if illustration, it will be understood that various modifications may be made without departing from the sprit and scope of the invention. Accordingly, the invention should not be limited except as by the appended claims.

What is claimed is:

1. A test and measurement instrument comprising:
an input processor configured to receive an input signal and to produce a digital signal;
a trigger signal generator configured to generate a trigger signal on the occurrence of a trigger event; and
an acquisition memory configured to store a seamless block of digital data from the digital signal in response to the trigger signal;
the trigger signal generator comprising:
a time to frequency converter configured to convert a frame of digital data from the digital signal into a first frequency spectrum having at least one frequency bin with a first width across a combined frequency spectrum and a second frequency spectrum having at least one frequency bin with a second width across the combined frequency spectrum such that the second width is different from the first width across the combined frequency spectrum, and combining the first frequency spectrum and the second frequency spectrum into the combined frequency spectrum with at least two frequency bins having dissimilar frequency widths wherein the frequency bins and filters corresponding to the frequency bins are not equally spaced across the combined frequency spectrum; and a circuitry configured to generate the trigger signal when a power amplitude value of any of the at least two frequency bins violates an associated reference power level.

2. The test and measurement instrument of claim 1 in which the associated reference power level is set according to a spectrum emission mask.

3. The test and measurement instrument of claim 1, in which the associated reference power level is set according to a user-defined spectrum emission mask.

4. The test and measurement instrument of claim 1 in which the time to frequency converter comprises:
a first downconverter and a first time to frequency transform together used to generate the first frequency spectrum; and
a second downconverter and a second time to frequency transform together used to generate the second frequency spectrum.

5. The test and measurement instrument of claim 4 in which the first downconverter is a first re-sampler and the second downconverter is a second re-sampler.

6. The test and measurement instrument of claim 4, further comprising a resolution bandwidth window coupled to the first downconverter, and a second resolution bandwidth window coupled to the second downconverter.

7. The test and measurement instrument of claim 1 in which the time to frequency converter comprises:
a first time to frequency transform structured to accept an output from a downconverter and generate the first frequency spectrum; and
a second time to frequency transform structured to accept the output from the downconverter and generate the second frequency spectrum.

8. The test and measurement instrument of claim 7, further comprising a first resolution bandwidth window and a second resolution bandwidth window coupled to the downconverter.

9. The test and measurement instrument of claim 7, in which the downconverter is a re-sampler.

10. The test and measurement instrument of claim 1, in which the frame of digital data is converted into a first set of spectra according to a first resultant bandwidth, and a second set of spectra according to a second resultant bandwidth; and further comprising:
means for combining the first set of spectra to produce a first bitmap database having a plurality of cells arranged in an array of rows and columns;
means for combining the second set of spectra to produce a second bitmap database having a plurality of cells arranged in an array of rows and columns; and
means for generating a density trace having a plurality of points, wherein the value of each point indicates a density of one or more of the columns of the first bitmap database and a density of one or more of the columns of the second bitmap database above an associated amplitude threshold.

11. The test and measurement instrument of claim 10, in which the means for generating the trigger signal is structured to generate the trigger signal when any point of the density trace violates an associated density threshold.

12. A method in a test and measurement instrument, the method comprising:
receiving an input signal and producing a digital signal at an input processor;
generating, by a trigger signal generator, a trigger signal on an occurrence of a trigger event; and
storing, at an acquisition memory, a seamless block of digital data from the digital signal in an acquisition memory in response to the trigger signal; in which generating a trigger signal comprises:
converting, by a time to frequency converter, a frame of digital data from the digital signal into a first frequency spectrum having at least one frequency bin with a first width across a combined frequency spectrum and a second frequency spectrum having at least one frequency bin with a second width across the combined frequency spectrum such that the second width is different from the first width across the combined frequency spectrum, and combining the first frequency spectrum and the second frequency spectrum into the combined frequency spectrum with at least two frequency bins having dissimilar frequency widths wherein the frequency bins and filters corresponding to the frequency bins are not equally spaced across the combined frequency spectrum; and
generating, by the trigger signal generator, the trigger signal when a power amplitude value of any of the at least two frequency bins violates an associated reference power level.

13. The method of claim 12, further comprising:
setting the associated reference power level according to a spectrum emission mask.

14. The method of claim 12, in which converting a frame of digital data from the digital signal into a frequency spectrum having at least two frequency bins comprises:
using a first downconverter and a first time to frequency transform together to generate the first frequency spectrum; and
using a second downconverter and a second time to frequency transform together to generate the second frequency spectrum.

15. The method of claim 14, further comprising:
setting a first resolution bandwidth for the first time to frequency transform; and setting a
second resolution bandwidth for the second time to frequency transform.

16. The method of claim 12, in which converting a frame of digital data from the digital signal into a frequency spectrum having at least two frequency bins comprises:
accepting an output from a down converter and generating the first frequency spectrum using a first time to frequency transform; and
accepting the output from the down converter and generating the second frequency spectrum using a second time to frequency transform.

17. The method of claim 16, further comprising:
setting a first resolution bandwidth window for the first time to frequency transform; and
setting a second resolution bandwidth window for the second time to frequency transform.

18. The method of claim 12 in which converting a frame of digital data from the digital signal into a frequency spectrum having at least two frequency bins comprises:
converting the frame of digital data into a first set of spectra according to a first resultant bandwidth and into a second set of spectra according to a second resultant bandwidth;
combining the first set of spectra to produce a first bitmap database having a plurality of cells arranged in an array of rows and columns;

combining the second set of spectra to produce a second bitmap database having a plurality of cells arranged in an array of rows and columns; and generating a density trace having a plurality of points, wherein the value of each point indicates a density of one or more of the columns of the first bitmap database and a density of one or more of the columns of the second bitmap database above an associated amplitude threshold.

19. The method of claim 18 in which generating the trigger signal comprises:

generating the trigger signal when any point of the density trace violates an associated density threshold.

20. A test and measurement instrument comprising:

an input processor configured to receive an input signal;

an analog-to-digital converter configured to receive the input signal and output a digital signal;

a trigger signal generator configured to generate a trigger signal on an occurrence of a trigger event and to combine a first frequency spectrum and a second frequency spectrum into a combined frequency spectrum having at least two frequency bins of dissimilar widths wherein the frequency bins and filters corresponding to the frequency bins are not equally spaced across the combined frequency spectrum, the trigger signal generator comprising:

a first fast Fourier transformer configured to convert the digital data into the first frequency spectrum having at least one frequency bin with a first width across the combined frequency spectrum, a second fast Fourier transformer configured to convert the digital data into the second frequency spectrum having at least one frequency bin with a second width across the combined frequency spectrum such that the second width is different from the first width across the combined frequency spectrum, and a circuitry configured to generate the trigger signal when a power amplitude value of any of the at least two frequency bins of the combined frequency spectrum violates an associated reference power level; and an acquisition memory configured to store a block of digital data from the digital signal in response to the trigger signal.

\* \* \* \* \*